(12) United States Patent
Matsuyama

(10) Patent No.: US 6,292,250 B1
(45) Date of Patent: Sep. 18, 2001

(54) SUBSTRATE PROCESS APPARATUS

(75) Inventor: Yuji Matsuyama, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/370,210

(22) Filed: Aug. 9, 1999

(30) Foreign Application Priority Data

Aug. 10, 1998 (JP) .................................................. 10-239473

(51) Int. Cl.$^7$ .......................... G03B 27/32; G03B 29/00; G03D 5/00; B05C 11/02; B05C 11/00

(52) U.S. Cl. ................................. 355/27; 355/28; 355/29; 396/611; 118/52; 118/58; 118/56; 118/666; 118/667; 118/668

(58) Field of Search .................................. 355/27, 28, 29; 396/611; 48/52, 58, 56, 666–668

(56) References Cited

U.S. PATENT DOCUMENTS 5,826,129 * 10/1998 Hasebe et al. ........................ 396/611
5,876,280 * 3/1999 Kitano et al. ......................... 454/187
5,972,110 * 10/1999 Akimoto ................................ 118/52

FOREIGN PATENT DOCUMENTS 10135307   5/1998   (JP) .

* cited by examiner

Primary Examiner—Russell Adams
Assistant Examiner—Khaled Brown
(74) Attorney, Agent, or Firm—Rader, Fishman & Grauer (57) ABSTRACT

A first cooling unit group and a second cooling unit group are disposed in the vicinity of a resist coating unit group. Each of the first cooling unit group and the second cooling unit group is composed of various cooling units. Each of the cooling units cools a wafer. A first heating unit group and a second heating unit group are disposed in the vicinity of a developing unit group. Each of the first heating unit group and the second heating unit group is composed of various heating units. Each of the heating units heats a wafer. A first conveying unit is disposed between the cooling unit groups. A second conveying unit is disposed between the heating unit groups. A transfer table is disposed between the conveying units. The transfer table temporarily holds a wafer. The first conveying unit conveys a wafer among the resist coating unit group, the transfer table, and the cooling unit groups. Thus, even if as the size of a substrate becomes large and thereby large heating unit groups are required, the film thickness of a resist film coated on a substrate can be suppressed from varying against heat generated from the heating unit groups.

10 Claims, 6 Drawing Sheets

SUBSTRATE PROCESS APPARATUS

BACKGROUND OF THE INVENTION

1. Field of the Invention

The present invention relates to a substrate process apparatus.

2. Description of the Related Art

At a photo resist coating step of a semiconductor fabrication, resist is coated as a resist film on the front surface of for example a semiconductor wafer (hereinafter referred to as wafer). A pattern is exposed on the resist film. The pattern is developed on the wafer with developing solution. Such a sequence of processes is performed by a coating/developing apparatus.

The coating/developing apparatus is composed of various units such as a cooling unit, a heating unit, a resist coating unit, and a developing unit. The cooling unit cools a wafer. The heating unit heats a wafer. The resist coating unit coats resist solution to a wafer. The developing unit develops a patter on a wafer. To compactly structure the coating/developing apparatus, a plurality of heating units and cooling units are piled up as a heat treatment unit group. In the heat treatment unit group, heating units are disposed above cooling units so as to prevent heat interference. In a conventional coating/developing apparatus, a heat treatment unit group and a conveying unit are disposed in the vicinity of the resist coating unit and the developing unit so as to further reduce the space of the apparatus.

However, as the size of a wafer becomes large, the size of the required process apparatus becomes large. To reduce the space of the apparatus, it is necessary to further integrally dispose each process unit. However, when heating units become large, the amount of heat generated therefrom become large. Thus, when heating units as process units of the heat treatment unit group are disposed in the vicinity of a resist coating unit, heat generated therefrom may cause the film thickness of a resist film to vary.

SUMMARY OF THE INVENTION

The present invention is made from the above-described point of view. An object of the present invention is to provide a substrate process apparatus that prevents the film thickness of a resist film from varying against the influence of a large heating unit and a large cooling unit.

To solve such a problem, an aspect of the present invention is a substrate process apparatus, comprising a resist coating unit for coating resist solution to a substrate, a developing unit for supplying developing solution to a substrate, a plurality of cooling units for cooling substrates, a plurality of heating units for heating substrates, and a conveying unit for holding a substrate with a hold member and conveying the substrate, wherein the plurality of cooling units are piled up as a cooling unit group, wherein the plurality of heating units are piled up as a heating unit group, wherein the cooling unit group is disposed in the vicinity of the resist coating unit, wherein the heating unit group is disposed in the vicinity of the developing unit, and wherein the conveying unit is disposed between the resist coating unit and the developing unit.

Thus, heating units and cooling units are separately disposed. The cooling units are disposed in the vicinity of a resist coating unit that is sensitive against a temperature change. The heating units are disposed in the vicinity of a developing unit that is less sensitive against a temperature change. Thus, since heat generated from the heating units does not affect the resist coating unit that is sensitive against a temperature change, the film thickness of a resist film can be suppressed from varying.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1:
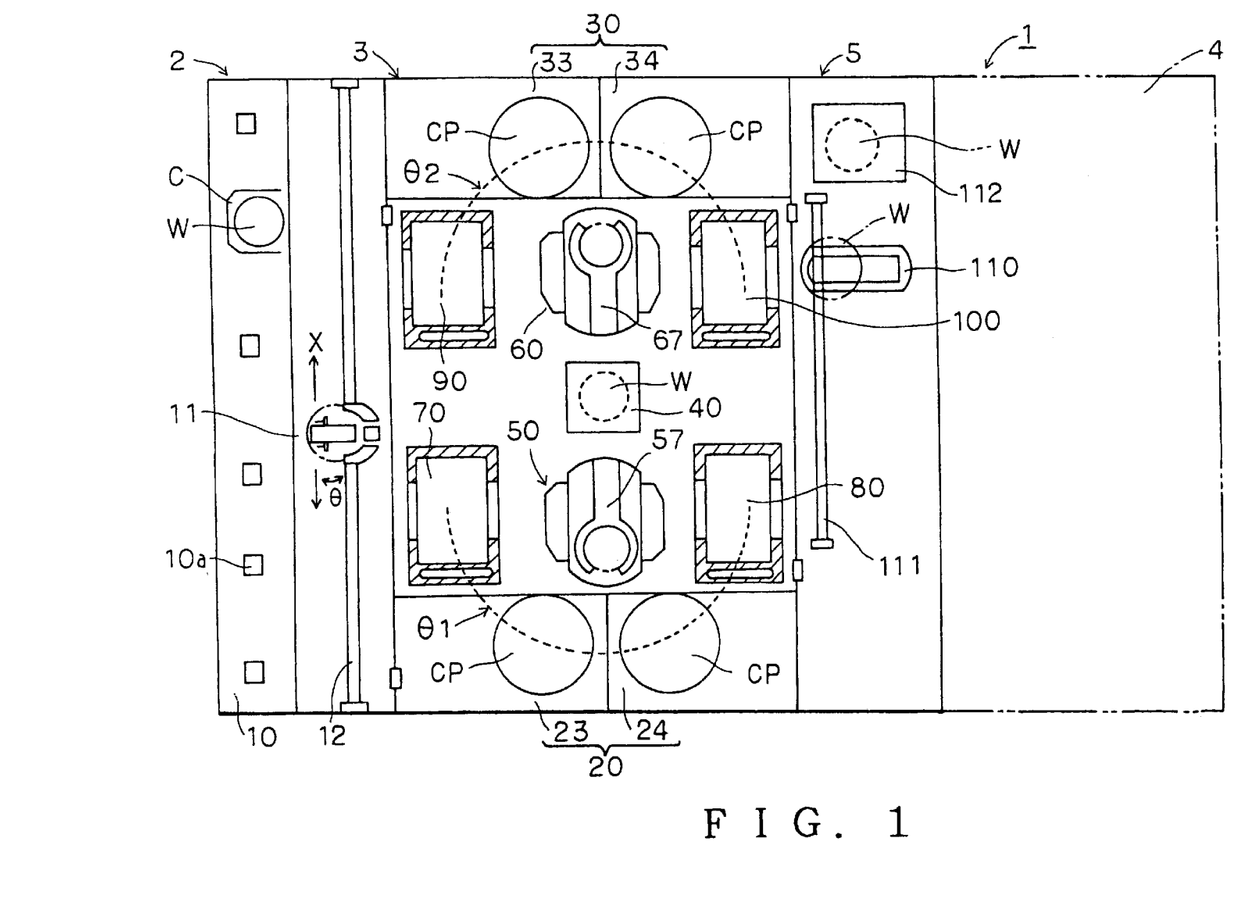
FIG. 1 is a partial plan view showing the structure of a coating/developing apparatus according to an embodiment of the present invention.
Figure 2:
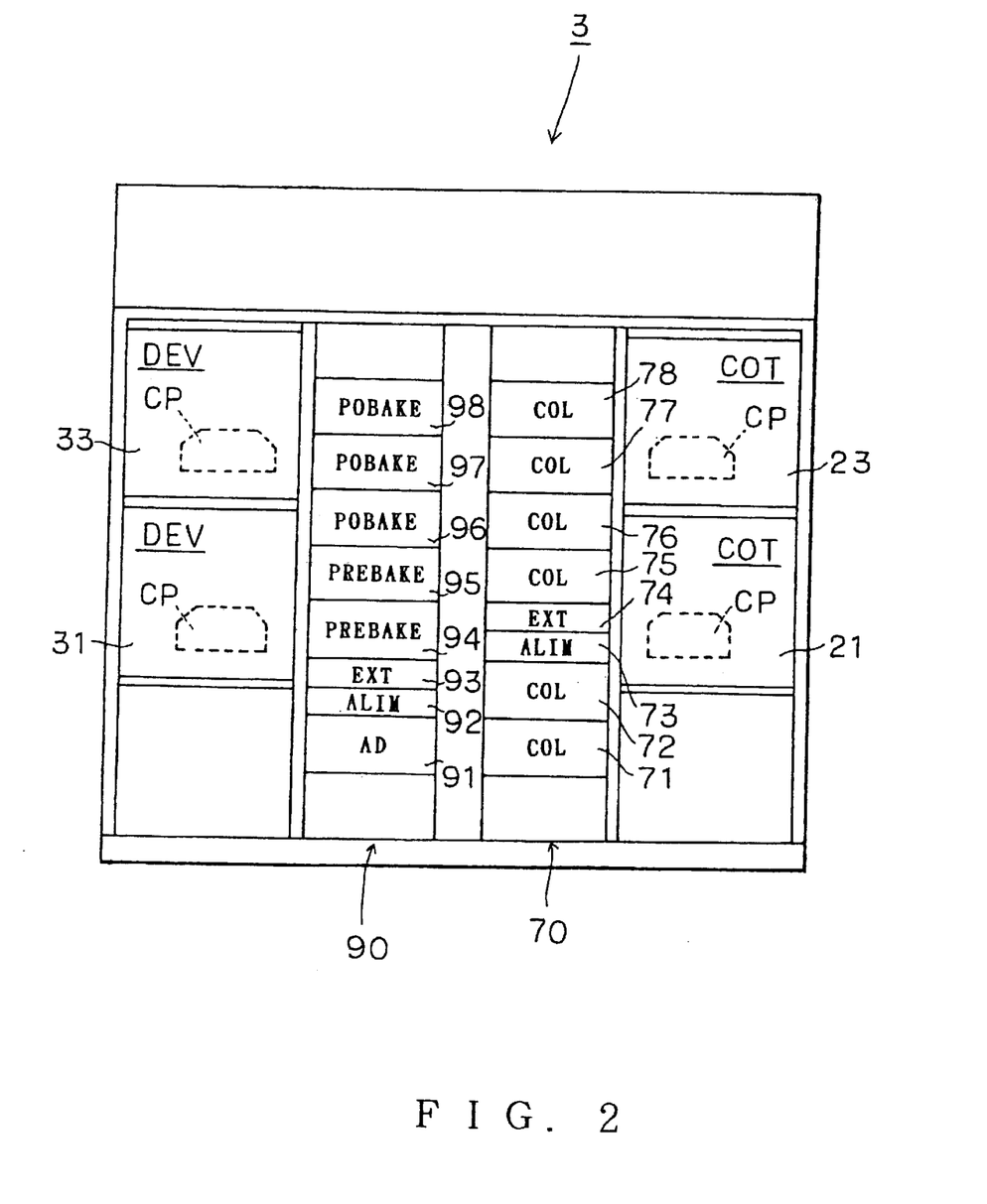
FIG. 2 is a side view showing the structure of the coating/developing apparatus viewed from a cassette station.
Figure 3:
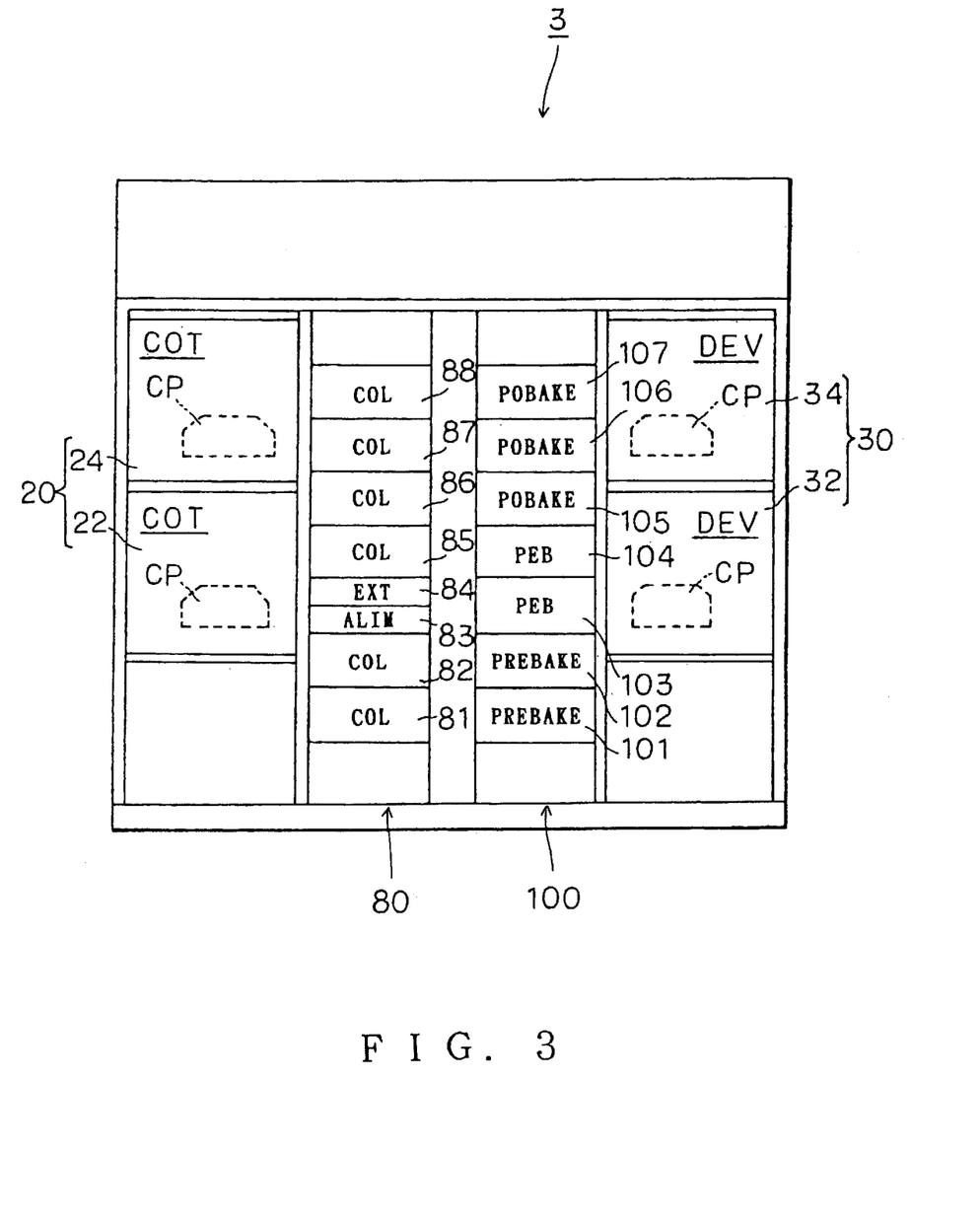
FIG. 3 is a side view showing the structure of the coating/developing apparatus viewed from an interface portion.

Next, with reference to the accompanying drawings, embodiments of the present invention will be described. FIG. 1 is a plan view showing the structure of a coating/developing apparatus 1 according to an embodiment of the present invention. FIGS. 2 and 3 are side views showing the structure of the coating/developing apparatus 1.

The coating/developing apparatus 1 has a cassette station 2, a process station 3, and an interface portion 5 that are integrally connected. The cassette station 2 loads and unloads a cassette C from the outside to the coating/developing apparatus 1. The cassette C accommodates for example 25 wafers W. In addition, the cassette station 2 loads and unloads a wafer W to/from a cassette C. The process station 3 has various process units that perform various processes for wafers W. The process units are piled up. The interface portion 5 transfers a wafer W to/from an exposing unit 4 disposed adjacent to the process station 3.

As shown in FIG. 1, a plurality of cassettes C are placed at positions of alignment protrusions 10*a* on the cassette table 10 in such a manner that wafer loading/unloading openings of the cassettes face the process station 3. In other words, the cassettes C are aligned in the X direction (the vertical direction of FIG. 1). A wafer conveying member 11 as a loading/unloading mechanism can travel along a conveying path 12 in the alignment direction (the X direction) of cassettes C and the alignment direction of wafers W accommodated in each cassette C (the Z direction member 11 selectively accesses each wafer W accommodated in each cassette C so as to load and unload each wafer W to/from each cassette C. In addition, the wafer conveying member 11 can rotate in the θ direction so as to access an extension unit of a first cooling unit group 70 and an alignment unit 92 of a first heating unit group 90 (that will be described later).

On the right (the front side) of the process station 3, a resist coating unit group 20 as a liquid process unit that supplies liquid to a substrate and processes the substrate with the liquid is disposed. On the left (the rear side) of the process station 3, a developing unit group 30 as a liquid process unit that supplies liquid to a substrate and processes the substrate with the liquid is disposed.

As shown in FIGS. 2 and 3, the resist coating unit group 20 has resist coating units 21, 22, 23, and 24. Each of the resist coating units 21, 22, 23, and 24 coats resist solution on a wafer W placed in a cup CP so as to perform a resist coating process for the wafer W. The resist coating units 21 and 22 are adjacently disposed. The resist coating units 23 and 24 are disposed above the resist coating units 21 and 22, respectively.

The developing unit group 30 has developing units 31, 32, 33, and 33. Each of the developing units 31, 32, 33, and 33 supplies developing solution to a wafer W placed in a cup CP and performs a developing process for the wafer W. The developing units 31 and 33 are adjacently disposed. The developing units 33 and 34 are disposed above the developing units 31 and 32, respectively.

Figure 4:
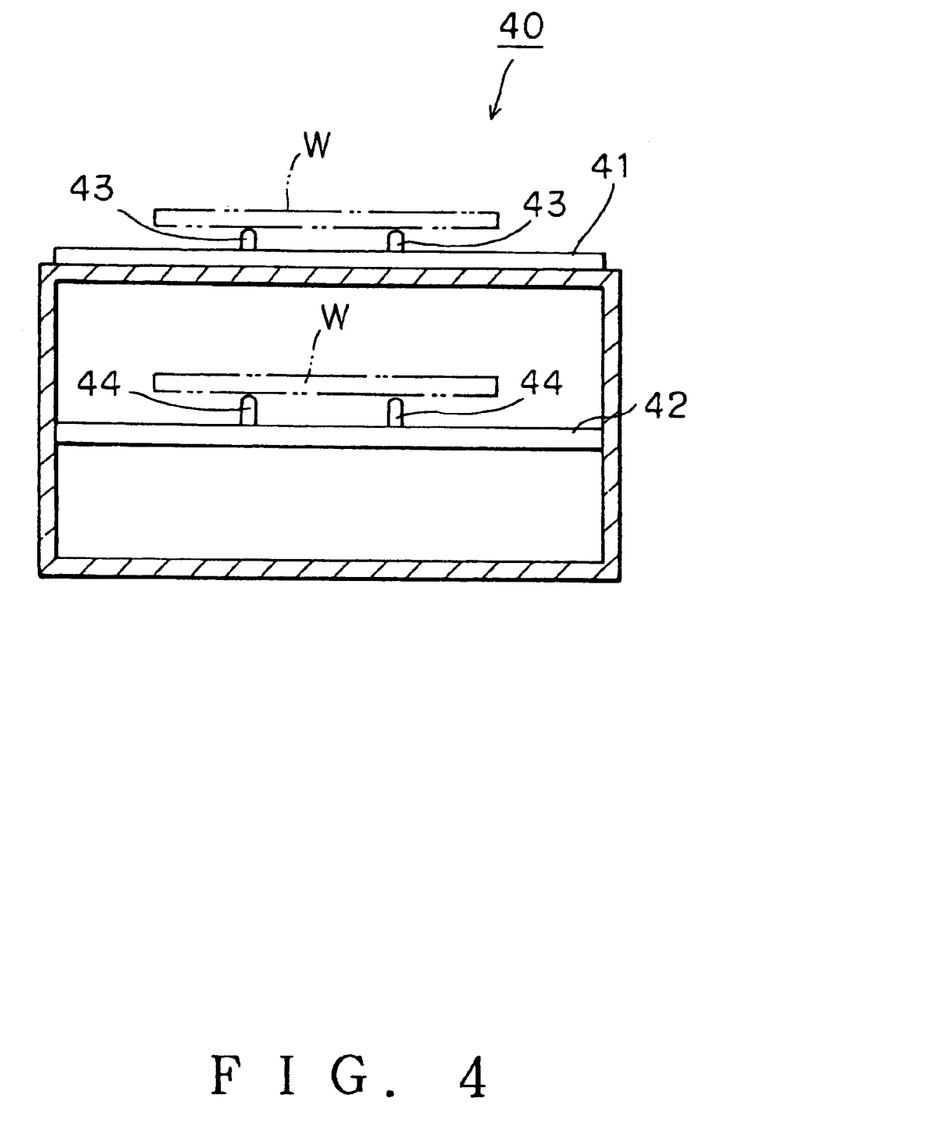
FIG. 4 is a sectional view for explaining the structure of a transfer table disposed in the coating/developing apparatus.

A transfer table 40 as a transfer mechanism is disposed at a center portion of the process station 3. A wafer W can be placed on the transfer table 40. As shown in FIG. 4, the transfer table 40 has an upper table 41 and a lower table 42. The upper table 41 has for example three hold pins 43 that hold the rear surface of a wafer W. Likewise, the lower table 42 has for example three hold pins 44 that hold the rear surface of a wafer W. Thus, the transfer table 40 can hold two wafers W with the hold pins 43 and 44 at a time.

The resist coating unit group 20 and the developing unit group 30 are oppositely disposed with the transfer table 40. A first conveying unit 50 is disposed between the resist coating unit group 20 and the transfer table 40. A second conveying unit 60 is disposed between the developing unit group 30 and the transfer table 40. Thus, each of the first conveying unit 50 and the second conveying unit 60 can transfer a substrate W through the transfer table 40.

The structure of the first conveying unit 50 is basically the same as the structure of the second conveying unit 60. Next, with reference to FIG. 5, the structure of the first conveying unit 50 will be described. The first conveying unit 50 has a wafer conveying means 54 in a cylindrical hold member 53. The cylindrical hold member 53 is composed of wall portions 51 and 52 that are oppositely disposed and that are connected at the upper end and the lower end thereof. The wafer conveying means 54 can lift up and down in the vertical direction (the Z direction of FIG. 5). The cylindrical hold member 53 is connected to a rotating shaft of a motor 55. The rotating force of the motor 55 causes the cylindrical hold member 53 to rotate along with the wafer conveying means 54 around the rotating shaft. Thus, the wafer conveying means 54 can rotate in the θ direction shown in FIG. 5.

Figure 5:
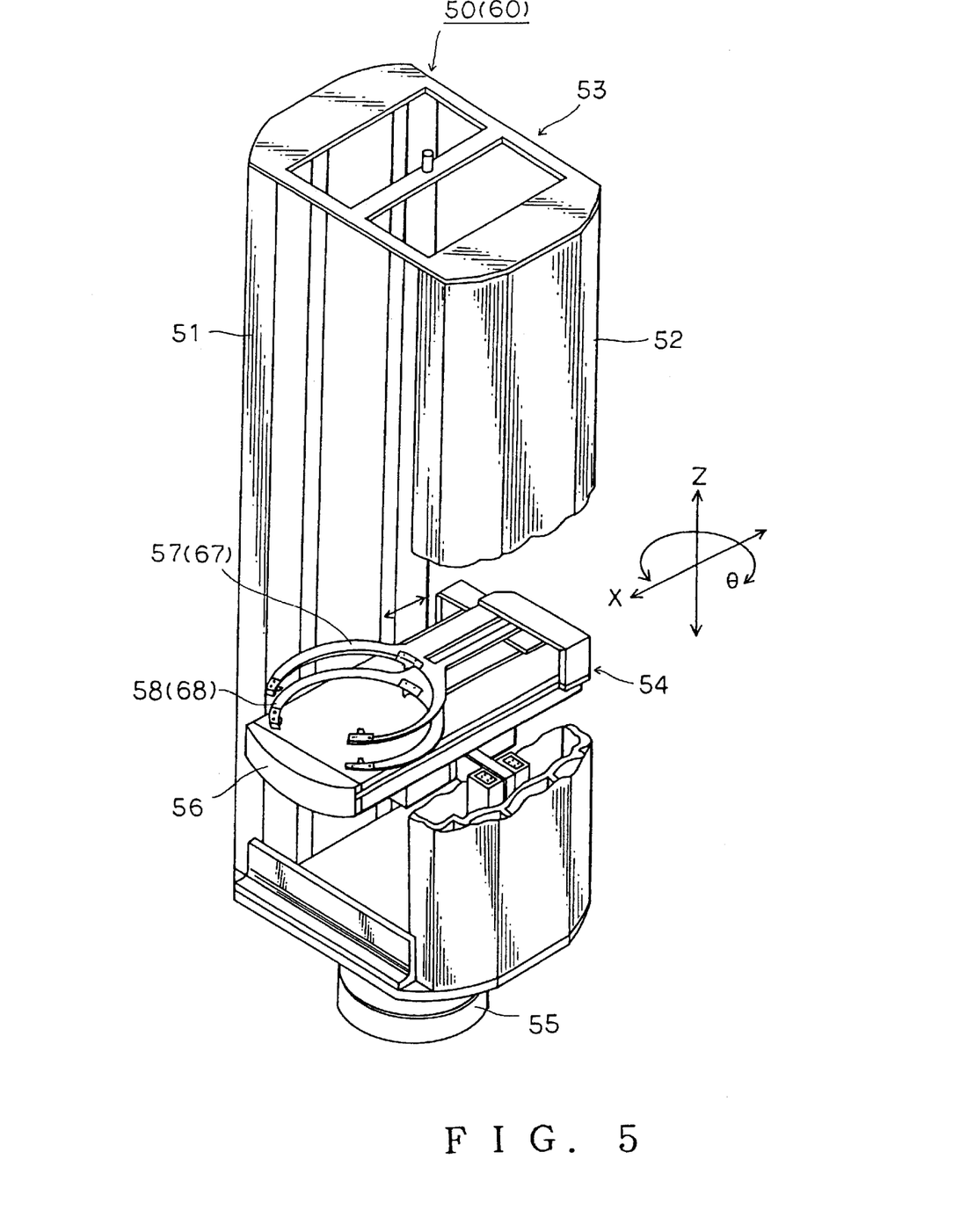
FIG. 5 is a perspective view showing the appearance of a first conveying unit disposed in the coating/developing apparatus.

Two pincettes 57 and 58 as an upper hold member and a lower hold member that hold wafers W are disposed on a conveying pedestal 56 of the wafer conveying means 54. The structure of the pincette 57 is basically the same as the structure of the pincette 58. The pincettes 57 and 58 are structured so that they can pass through a side opening portion formed between wall portions 51 and 52 of the cylindrical hold member 53. The pincettes 57 and 58 can be traveled forward and backward by respective motors (not shown) disposed in the conveying pedestal 56. Likewise, the second conveying unit 60 has pincettes 67 and 68 that have the same function and structure as those of the pincettes 57 and 58 of the first conveying unit 60.

A first cooling unit group 70 and a second cooling unit group 80 are disposed on both sides of the first conveying unit 50 in the vicinity of the resist coating unit group 20 so that the first conveying unit 50 can access the first cooling unit group 70 and the second cooling unit group 80. In other words, the first cooling unit group 70 and the second cooing unit group 80 are disposed on a circle of radius θ1 with a center of the first conveying unit 50. In addition, the resist coating units 23 and 24 of the resist coating unit group 20 are disposed on the circle of radius θ1.

A first heating unit group 90 and a second heating unit group 100 are disposed on both sides of the second conveying unit 60 in the vicinity of the developing unit group 30 so that the second conveying unit 60 can access the first heating unit group 90 and the second heating unit group 100. In other words, the first heating unit group 90 and the second heating unit group 100 are disposed on a circle of radius θ2 with a center of the second conveying unit 60. In addition, the developing unit 33 and 34 of the developing unit group 30 are disposed on the circle of radius θ2.

The first cooling unit group 70 and the first heating unit group 90 are disposed opposite to the cassette station 2. The second cooling unit group 80 and the second heating unit group 100 are disposed opposite to the interface portion 5.

Next, with reference to FIG. 2 showing the structure of the process station 3 viewed from the cassette station 2, the structures of the first cooling unit group 70 and the first heating unit group 90 will be described. The first cooling unit group 70 has for example seven units—two cooling units 71 and 72, one alignment unit 73, one extension unit 74, and four cooling units 75, 76, 77, and 78 that are successively piled up. Each of the cooling units 71 and 72 cools a wafer W at a predetermined temperature. The alignment unit 73 aligns a wafer W. The extension unit 74 temporarily holds a wafer W. The first heating unit group 90 has for example seven units—one adhesion unit 91, one alignment unit 92, one extension unit 93, two pre-baking units 94 and 95, and three post-baking units 96, 97, and 98 that are successively piled up. The adhesion unit 91 improves adhesion of resist against a wafer W. Each of the pre-baking units 94 and 95 performs a heating process for a wafer W that has been coated with resist. Each of the post-baking units 96, 97, and 98 performs a heating process for a wafer w that has been developed.

Next, with reference to FIG. 3 showing the structure of the process station 3 viewed from the interface portion, the structures of the second cooling unit group 80 and the second heating unit group 100 will be described. The second cooling unit group 80 has for example seven units—two cooling units 81 and 82, one alignment unit 83, one extension unit 84, and three cooling units 85, 86, 87, and 88 that are successively piled up. The second heating unit group 100 has for example seven units—two pre-baking units 101 and 102, two post-exposure baking units 103 and 104, and three post-baking units 105, 106, and 107 that are successively piled up. Each of the post-exposure baking units 103 and 104 performs a heating process for a wafer W that has been exposed.

The interface portion 5 has a wafer conveying member 110 that can access the extension unit 84 of the second cooling unit group 80 and the post-exposure baking units 103 and 104 of the second heating unit group 100. The wafer conveying member 110 can travel in the X direction along rail 111. The wafer conveying member 110 can lift up and down in the Z direction (the vertical direction of FIG. 1). Moreover, the wafer conveying member 110 can rotate in the θ direction. The wafer conveying member 110 can convey a wafer W to the exposing unit 4 and a peripheral exposing unit 112.

The structure of the coating/developing apparatus 1 according to the embodiment of the present invention has been described above. Next, the operation and effect of the coating/developing apparatus 1 will be described.

The wafer conveying member 11 of the cassette station 2 accesses a cassette C and unloads a raw wafer w therefrom. The wafer conveying member 11 conveys the wafer W to the alignment unit 92 of the first heating unit group 90. The alignment unit 92 aligns the wafer W. Thereafter, the second conveying unit 60 holds the wafer W with the lower pincette 68 and conveys the wafer W to the adhesion unit 91 of the first heating unit group 90. The adhesion unit 91 performs a hydrophobic process for the wafer W. Thereafter, the second conveying unit 60 holds the wafer W with the pincette 68 and conveys the wafer W to the transfer table 40. The second conveying unit 60 places the wafer W on the hold pins 43 of the upper table 41 of the transfer table 40.

Thereafter, the first conveying unit 50 holds the wafer W with the lower pincette 58 and conveys the wafer W from the transfer table 40 to the first cooling unit group 70. The first conveying unit 50 loads the wafer W to for example the cooling unit 72 of the first cooling unit group 70. The cooling unit 72 performs a cooling process for the wafer W. Thereafter, the first conveying unit 50 holds the wafer W with the pincette 58 and conveys the wafer W to the resist coating unit group 20.

The first conveying unit 50 loads the wafer W to for example the resist coating unit 21 of the resist coating unit group 20. The resist coating unit 21 forms a resist film on the wafer W. Thereafter, the first conveying unit 50 holds the wafer W with the upper pincette 57 and conveys the wafer W to the transfer table 40. The first conveying unit 50 places the wafer W on the hold pins 44 of the lower table 42 of the transfer table 40.

The second conveying unit 60 holds the wafer W on the hold pins 44 with the pincette 68 and conveys the wafer W to the second heating unit group 100. The second conveying unit 60 loads the wafer W to for example the pre-baking unit 101 of the second heating unit group 100. The pre-baking unit 101 performs a predetermined heating process for the wafer W.

Thereafter, the second conveying unit 60 holds the wafer w with the pincette 68 and conveys the wafer W to the second cooling unit group 80. The second conveying unit 60 loads the wafer W to for example the cooling unit 85 of the second cooling unit group 80. The cooling unit 85 performs a cooling process for the wafer W. Thereafter, the second conveying unit 60 loads the wafer W to the extension unit 84. The extension unit 84 temporarily holds the wafer W.

Next, the wafer conveying member 110 conveys the wafer W from the extension unit 84 to the peripheral exposing unit 112. The peripheral exposing unit 112 removes an unnecessary resist film from the periphery of the wafer W. Thereafter, the wafer conveying member 110 conveys the wafer W from the peripheral exposing unit 112 to the exposing unit 4. The exposing unit 4 performs a predetermined exposing process for the wafer W.

Thereafter, the wafer conveying member 110 conveys the wafer W from the exposing unit 4 to the second heating unit group 100. The wafer conveying member 110 loads the wafer W to for example the post-exposure baking unit 103. Thereafter, the second conveying unit 60 holds the wafer W with the pincette 68 and conveys the wafer W to for example the cooling unit 81 of the second cooling unit group 80.

Thereafter, the first conveying unit 50 holds the wafer W with the pincette 58 and conveys the wafer W to the transfer table 40. The first conveying unit 50 places the wafer W on the hold pins 44 of the lower table 42 of the transfer table 40. Thereafter, the first conveying unit 50 holds the wafer W on the hold pins 44 with the pincette 68 and conveys the wafer W from the transfer table 40 to the developing unit group 30. The first conveying unit 50 loads the wafer W to for example the developing unit 31. The developing unit 31 performs for example a predetermined developing process for the wafer W.

Thereafter, the second conveying unit 60 holds the wafer W with the pincette 67 and conveys the wafer W to the second heating unit group 100. The second conveying unit 60 loads the wafer W to for example the post-baking unit 105 of the second heating unit group 100. The post-baking unit 105 performs a heating process for the wafer W that has been developed.

Thereafter, the second conveying unit 60 holds the wafer W with the pincette 67 and conveys the wafer W to the transfer table 40. The second conveying unit 60 places the wafer W on the hold pins 43 of the upper table 41 of the transfer table 40.

Thereafter, the first conveying unit 50 holds the wafer W on the hold pins 43 with the pincette 58 and conveys the wafer W to the first cooling unit group 70. The first conveying unit 50 loads the wafer W to for example the cooling unit 71 of the first cooling unit group 70. The cooling unit 71 forcedly cools the wafer W to a predetermined temperature. Thereafter, the first conveying unit 50 loads the wafer W to the extension unit 74. The extension unit 74 temporarily holds the wafer W. The wafer conveying member 11 conveys the wafer W from the extension unit 74 and loads the wafer W to a cassette C on the cassette table 10. Thus, a sequence of the coating and developing processes for the wafer W has been completed.

In the coating/developing apparatus 1 according to the embodiment of the present invention, the cooling unit groups 70 and 80 are spaced apart from the heating unit groups 90 and 100. The cooling unit groups 70 and 80 are disposed in the vicinity of the resist coating unit group 20 that is sensitive to a temperature change. The heating unit groups 90 and 100 are disposed in the vicinity of the developing unit group 30 that is less sensitive to a temperature change. Thus, heat generated from the first hating unit group 90 and the second heating unit group 100 hardly affects the resist coating unit group 20. Consequently, when each of the resist coating units 21, 22, 23, and 24 of the resist coating unit group 20 forms a resist film, the film thickness of the resist film can be suppressed from varying against a temperature change.

The first conveying unit 50 conveys a wafer W among the resist coating units 21, 22, 23, and 24, the transfer table 40, and the cooling unit groups 70 and 80. The second conveying unit 60 conveys a wafer W among the developing units 31, 32, 33, and 34, the conveying table 40, and the heating unit groups 90 and 100. Thus, the second conveying unit 60 holds heated wafers W with the pincettes 67 and 68. Consequently, the first conveying unit 50 does not hold heated wafers W with the pincettes 57 and 58. As a result, the pincettes 57 and 58 of the first conveying unit 50 are not heated with heat of wafers W. Thus, a resist film coated on a wafer W is not heated with heat of the pincettes 57 and 58. Consequently, while the first conveying unit 50 is conveys a wafer W, the film thickness of a resist film coated thereon can be prevented from varying.

The heating unit groups are spaced apart from the cooling unit groups. The cooling unit groups are disposed in the vicinity of the resist coating units. The heating unit groups are disposed in the vicinity of the developing units. Thus, heat generated from the heating unit groups can be suppressed from affecting the resist coating units. Consequently, when a resist film is formed, the film thickness thereof can be suppressed from varying against heat.

Since the first conveying unit does not convey a substrate that has been heated, the hold members of the first conveying unit is not heated by the substrate. Thus, the hold members of the first conveying unit do not transmit heat to the substrate. While conveying a substrate, the first conveying unit does not affect the resist film on the substrate. Thus, the yield can be prevented from lowering.

In addition, since the transfer table has a plurality of tables, the first conveying unit and the second conveying unit are prevented from being stuck with the transfer table. Consequently, since the conveying units are effectively operated, the substrate process capacity can be improved.

Next, with reference to FIG. 6, another embodiment of the present invention will be described. In the embodiment, the transfer table 40 has a mechanism that adjusts the temperature of a wafer W.

Figure 6:
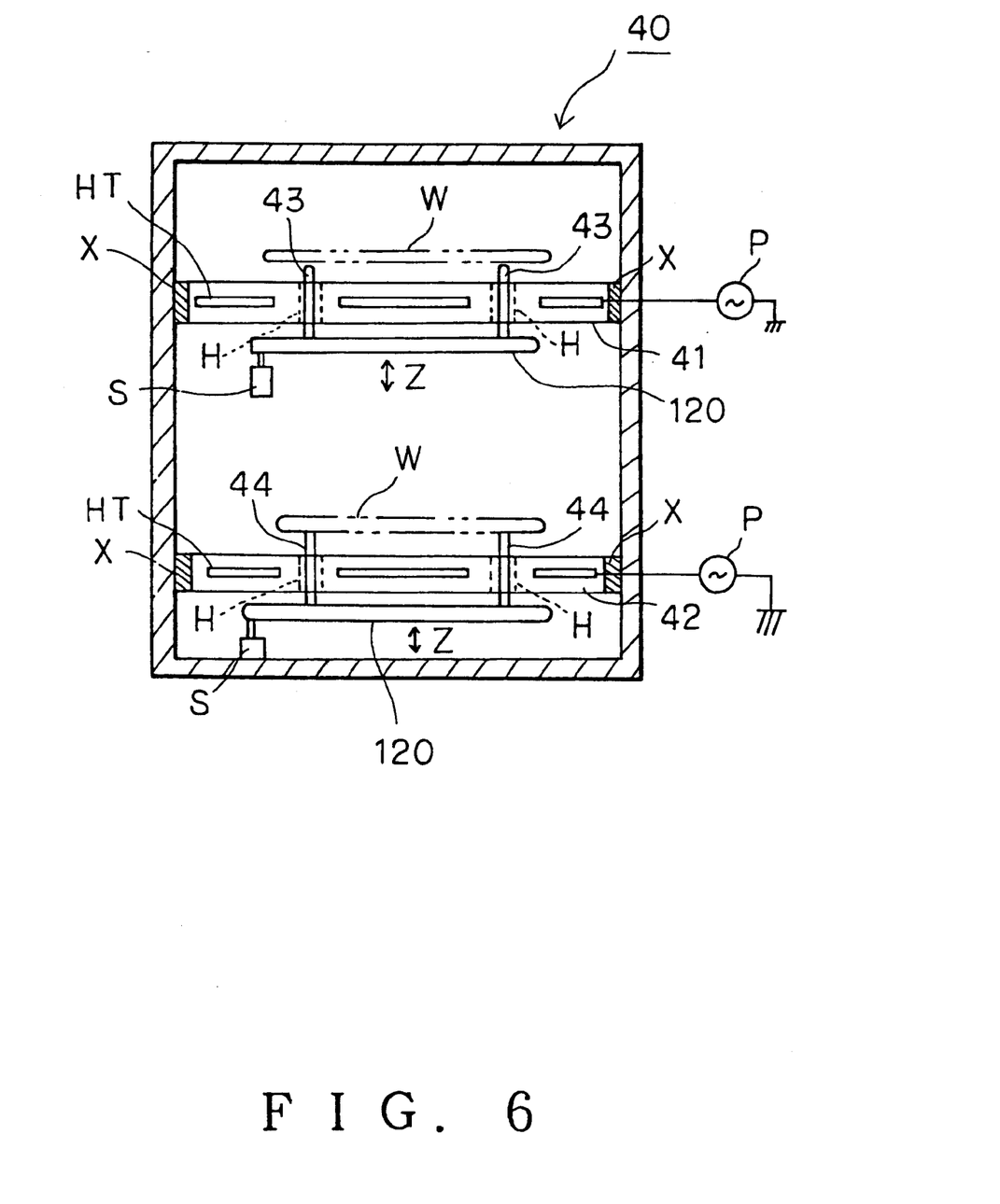
FIG. 6 is a sectional view for explaining the structure of a transfer table according to another embodiment of the present invention.

As shown in FIG. 6, the transfer table 40 has an upper table 41 and a lower table 42. The upper table 41 and the lower table 42 have respective heating members HT. Power supplies P are connected to the respective heating members HT. The power supplies P supply power to the heating members HT. Thus, desired temperatures can be set to the upper table 41 and the lower table 42.

The upper table 41 and the lower table 42 are connected through a heat insulating member X so as to prevent heat from being transmitting in the transfer table 40.

Through-holes H for a plurality of (for example, three) hold pins 43 that hold the rear surface of a wafer W are formed in the upper table 41. Likewise, through-holes H for a plurality of (for example, three) hold pins 44 that hold the rear surface of a wafer W are formed in the lower table 42.

The three hold pins 43 and the three hold pins 44 are disposed on respective hold-pin tables 120. The hold-pin tables 120 can independently lift up and down in the vertical direction with respective drive sources such as air cylinders S.

Thus, while the transfer table 40 temporarily holds a wafer W, it can be suppressed from being affected by a temperature change. When a wafer W is conveyed from the transfer table 40 to a heating unit, since the temperature of the wafer W is kept constant, the wafer can be equally heated. Thus, the yield can be improved. When a wafer W is conveyed to a cooling unit, by setting the temperature of the upper table 41 or the lower table 42 to the process temperature of the cooling unit, the throughput of the process of the cooling unit can be improved.

A wafer W can be contacted to the upper table 41 or the lower table 42 by the operation of the air cylinder S. Alternatively, the wafer W may be spaced apart from the upper table 41 or the lower table 42. Thus, particles of the upper table 41 or the lower table 42 can be suppressed from adhering to the rear surface of the wafer W.

In the above-described embodiments, as substrate, wafers W were described. However, as substrates, LCD substrates and so forth can be considered.

According to the present invention, the heating unit groups are spaced apart from the cooling unit groups. The cooling unit groups are disposed in the vicinity of the resist coating units. The heating unit groups are disposed in the vicinity of the developing units. Thus, heat generated from the heating unit groups can be suppressed from affecting the resist coating units. Consequently, when a resist film is formed, the film thickness thereof can be suppressed from varying against heat.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing apparatus, comprising:

at least one resist coating unit that coats resist solution to a substrate;

at least one developing unit that supplies developing solution to the substrate;

a plurality of cooling units that cool substrates;

a plurality of heating units that heat substrates;

at least one first pile of units including at least two of said plurality of cooling units, said units of said first pile being piled up vertically and failing to include any one of said plurality of heating units;

at least one second pile of units including at least two of said plurality of heating units, said units of said second pile being piled up vertically and failing to include any one of said plurality of cooling units; and a conveyor system disposed between said resist coating unit and said developing unit, the conveyor system can convey the substrate from/to said resist coating unit, said developing unit, and said units of said first and second piles.

2. The substrate processing apparatus according to claim 1, wherein said conveyor system includes;

a first conveyor unit, disposed on a side of said resist coating unit, that conveys the substrate from/to said resist coating unit and said units of the first pile;

a second conveyor unit, disposed on a side of said developing unit, that conveys the substrate from/to said developing unit, and said units of the second pile; and a transfer mechanism arranged between said first conveyor unit and said second conveyor unit, said transfer mechanism can hold the substrate and allows the substrate to be transferred between the first and the second conveyor unit.

3. The substrate processing apparatus according to claim 2, wherein said first conveyor unit has a hold member that moves to places on a first circumference, and said second conveyor unit has a hold member that moves to places on a second circumference, wherein said substrate processing apparatus is provided with two resist coating units as said at least one resist coating unit, said two resist coating units disposed at different places on the first circumference, respectively, wherein said substrate processing apparatus is provided with two first piles as said at least one first pile, said two first piles disposed at different places on the first circumference, respectively, wherein said substrate processing apparatus is provided with two developing units as said at least one developing unit, said two developing units disposed at different places on the second circumference, respectively, and wherein said substrate processing apparatus is provided with two second piles as said at least one second pile, said two second piles disposed at different places on the second circumference, respectively.

4. The substrate processing apparatus according to claim 1 further comprising;

a cassette station that holds a cassette, said cassette being capable of accommodating a plurality of substrates; and a loading/unloading mechanism disposed in said cassette station, the loading/unloading mechanism loads and unloads the substrate to/from the cassette placed on said cassette station and conveys the substrate from/to said first pile and said second pile.

5. The substrate processing apparatus according to claim 1 further comprising;

an exposing unit that exposes a resist coating on a substrate; and an interface portion that allows a substrate to be conveyed between said exposing unit and said first and second piles.

6. The substrate process apparatus as set forth in claim 2, wherein said transfer mechanism has a plurality of tables that hold respective substrates, the tables being piled up.

7. The substrate process apparatus as set forth in claim 2, wherein said transfer mechanism has a portion that adjusts the temperature of a substrate.

8. A substrate processing apparatus, comprising:

a resist coating unit that coats resist solution to a substrate;

a developing unit that supplies developing solution to the substrate;

a plurality of cooling units that cools substrates;

a plurality of heating units that heats substrates;

a first pile of units including at least two of said plurality of cooling units, and said units of said first pile being piled up vertically and failing to include any one of said plurality of heating units;

a second pile of units including at least two of said plurality of heating units, said units of said second pile being piled up vertically and failing to include any one of said plurality of cooling units;

a first conveyor that conveys a substrate from/to said resist coating unit and said units of the first pile;

a second conveyor that conveys a substrate from/to said developing unit and said units of the second pile; and a transfer mechanism disposed between the first conveyor and the second conveyor, said transfer mechanism can hold the substrate and allow the substrate to be transferred between the first and the second conveyor.

9. The substrate process apparatus as set forth in claim 8, wherein said transfer mechanism has a plurality of tables that hold respective substrates.

10. The substrate process apparatus as set forth in claim 8, wherein said transfer mechanism has a portion that adjusts the temperature of a substrate.

* * * * *